(12) United States Patent
Thallner

(10) Patent No.: US 7,432,701 B2
(45) Date of Patent: Oct. 7, 2008

(54) ADJUSTING DEVICE AND ARRANGEMENT FOR ADJUSTING A WAFER

(76) Inventor: Erich Thallner, Bubing 71, 4782 St. Florian (AT)

( * ) Notice: Subject to any disclaimer, the term of this patent is extended or adjusted under 35 U.S.C. 154(b) by 133 days.

(21) Appl. No.: 11/130,950

(22) Filed: May 17, 2005

(65) Prior Publication Data

US 2005/0258851 A1    Nov. 24, 2005

(30) Foreign Application Priority Data

May 18, 2004    (DE) .................. 10 2004 024 649

(51) Int. Cl.
*G01R 31/28*    (2006.01)
(52) U.S. Cl. .................. 324/158.1; 356/432
(58) Field of Classification Search .......... 324/158.1, 324/750–758, 760–765; 356/432–444; 250/250, 250/260–267, 315.3, 339, 306–310, 330
See application file for complete search history.

(56) References Cited

U.S. PATENT DOCUMENTS

| 4,541,717 A | 9/1985 | Itamoto et al. .......... 356/244 |
| 4,922,277 A | 5/1990 | Carlson et al. .......... 354/317 |
| 5,549,756 A | 8/1996 | Sorensen et al. .......... 118/715 |
| 5,572,398 A * | 11/1996 | Federlin et al. .......... 361/234 |
| 6,299,713 B1 | 10/2001 | Bejtlich .......... 156/64 |
| 2002/0113056 A1 | 8/2002 | Sugaya et al. .......... 219/444.1 |

FOREIGN PATENT DOCUMENTS

| DE | 20309051 | 6/2003 |
| EP | 0269076 | 11/1987 |
| EP | 1047116 | 10/2000 |
| GB | 2 170 651 A | 8/1986 |
| JP | 58202543 A | 11/1983 |
| JP | 6151553 A | 5/1994 |
| WO | WO 98/14999 | 4/1998 |

OTHER PUBLICATIONS

Austrian Search Report—1 page.

* cited by examiner

*Primary Examiner*—Ha Nguyen
*Assistant Examiner*—Trung Q Nguyen
(74) *Attorney, Agent, or Firm*—Kusner & Jaffe

(57) ABSTRACT

An adjusting device with a mounting fixture (4) for mounting a wafer (2) on a mounting side (4a) of the mounting fixture (4), whereby the mounting fixture has at least one through-hole (5) directed essentially orthogonal to the mounting side (4a), is characterised in that the through-hole (5) on the mounting side (4a) has a smaller cross-section than on the entrance side (4b) of the through-hole (5) facing away from the mounting side (4a).

19 Claims, 2 Drawing Sheets

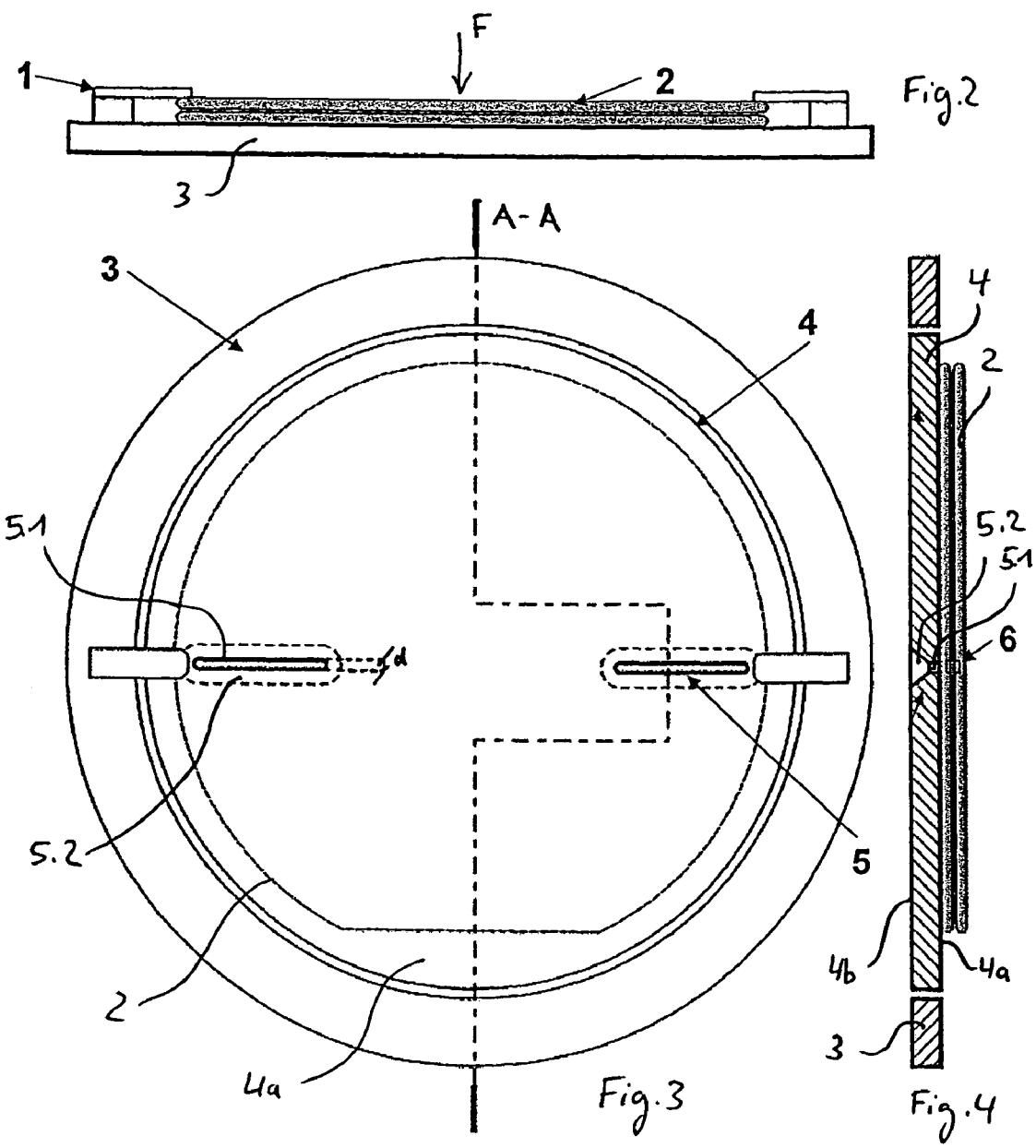

ADJUSTING DEVICE AND ARRANGEMENT FOR ADJUSTING A WAFER

Figure 1:
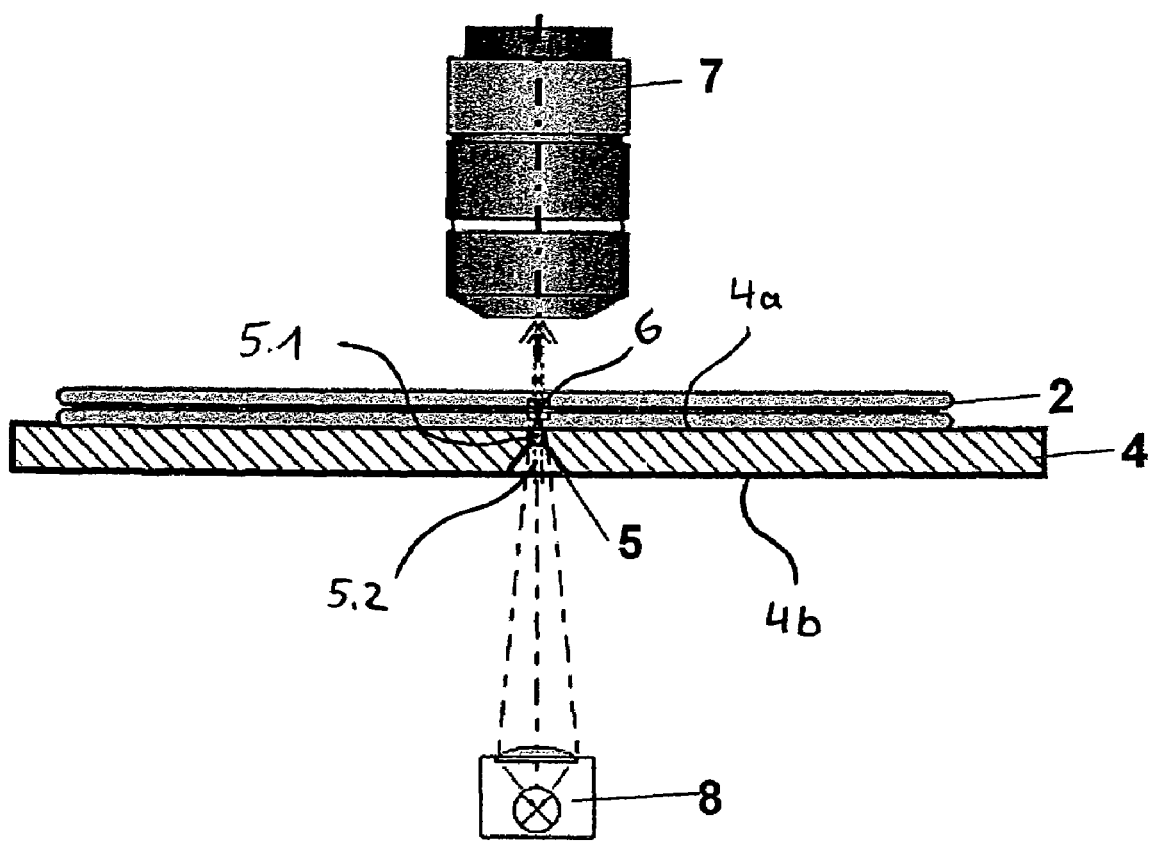

The invention relates to an adjusting device with a mounting fixture for mounting a wafer onto a mounting side of the mounting fixture, whereby the mounting fixture has at least one through-hole directed essentially orthogonal to the mounting side. The invention further relates to an arrangement for adjusting a wafer with such an adjusting device.

Such adjusting devices are used for example in a bond tool for infrared adjustments. The bond tools, which are also referred to as bond chucks, are used to adjust wafers optically with the aid of adjusting marks in the wafer and subsequently to transfer the adjusted wafer stack to a wafer bonder.

The adjustment is carried out for example with infrared illumination and requires cutouts in the bond chuck/bond tool for the transillumination of the wafer to a detection device lying opposite, a microscope for example.

The adjusting device is fixed to the bond chuck and the wafer is then aligned precisely with the aid of the adjusting marks.

After transfer of the bonds chucks into the wafer bonder, a permanent joint is produced by the application of mechanical pressure and temperature. The jointing of the wafers can be produced by adhesive layers (polymers), metals (e.g. Cu-Cu diffusion bonds) or metal alloys (e.g. CuSn eutectic solder alloys).

The cutouts are introduced into the bond chucks after the production of the bond chucks. The problem arises here that it is necessary on the one hand to provide a sufficiently large cutout in order to obtain a high light yield with the passage through the cutout. Furthermore, the manufacture of cutouts with very small diameters in the roughly 8 mm thick bond chucks is technically problematic. On the other hand, however, when contact pressure is applied on the wafer, e.g. during the thermo-compression bonding process, a pressure non-uniformity occurs over the cutout of the bond chuck, and this pressure non-uniformity is all the greater, the greater the diameter of the cutout. The cutout area thus leaves a defect in the bond interface. Bond interface is intended to mean the joint between the discs of the wafer.

The problem of the present invention, therefore, is to provide an adjusting device, with which defects can be minimised or eliminated and at the same time the production of which is more favourable.

The basic idea of the invention is to adapt the adjusting device symmetrically in the cross-section in such a way that a cutout area as small as possible with sufficient light transmission is provided on the contact side of the bond chuck with the wafer and a larger cutout area easy to produce from the manufacturing standpoint is provided on the other side.

Insofar as mention is made of wafer in connection with the invention, this stands vicariously for any kind of surface-area component which has to be brought precisely into contact with a surface-area jointing element.

In its most general form of embodiment, the invention relates to an adjusting device with a mounting fixture for mounting a wafer on a mounting side of the mounting fixture, whereby the mounting fixture has at least one through-hole directed essentially orthogonal to the mounting side, said through-hole having a smaller cross-section on the mounting side than on the entrance side of the through-hole facing away from the mounting side.

The mounting fixture can be a bond chuck, which receives the wafer and fixes the same, as necessary, with clamps. The effect of the smaller cross-section on the mounting side is that, depending on the size of the cross-section, faults are prevented from occurring in the bond interface after application of a pressing force at the point of the through-hole. Notwithstanding, it is ensured that the production of the through-hole—for example by drilling—is greatly simplified from the standpoint of the entrance side and the greater cross-section of the entrance side.

In a development of the invention, the through-hole is designed in such a way that it has a first portion, which extends from the mounting side into the through-hole and whose inner wall runs essentially parallel to the centre axis of the through-hole. This measure ensures that the stability of the through-hole on the mounting side is ensured when a pressing force is applied. In addition, the effect of this is that the light beam passing through the through-hole is bundled and refraction of the light is minimised. The smallest diameter of the first portion of the through-hole can be <7 mm, in particular <5 mm, preferably <3 mm and more preferably <1 mm.

In a further development of the invention, provision is made such that the through-hole has a second portion, which extends from the first portion up to the entrance side, whereby the cross-section of the second portion preferably increases conically up to the entrance side. The effect of this design is that the light entering on this side is bundled and the production of the through-hole on this side is much simpler.

The through-hole can be designed slot-shaped or round in cross-section. In the case of a slot-shaped design, the light yield is higher and the positioning is made somewhat easier, whilst on the other hand the round design is easier to produce.

Furthermore, provision is made such that the mounting fixture is essentially disc-shaped and has two slot-shaped through-holes arranged in the centre axis of the mounting fixture. The through-hole can be 2-12 mm deep, but preferably 8 mm deep. This essentially corresponds to the thickness of the mounting fixture, since the centre axis of the through-hole is essentially orthogonal to the mounting side of the mounting fixture. The first portion from the mounting side extends therein into the through-hole and ends after 0.1 mm-5 mm, but preferably after 1 mm. Following on therefrom is the second portion, which extends up to the end of the through-hole, i.e. up to the entrance side. A conical enlargement that runs at an angle of 70°-120°, preferably 90°, is especially easy to produce. At the same time, the effect of the conical enlargement is that the entrance of the light is bundled and guided in the direction of the first portion.

The properties of the adjusting device are improved by the fact that the mounting fixture is made from silicon carbide. Alternatively, it can also be made from titanium. These materials are to be preferred, since the flatness tolerance of the front and rear side of the bond chuck/mounting fixture is better than in the case of stainless steel alloys. The bonding result is again greatly improved as a result.

The invention also concerns an arrangement for the adjustment of a wafer with such an adjusting device, whereby light, in particular infrared light, strikes an optical detection device through the through-hole via a structure integrated into the wafer and means are provided for the alignment of the wafer based on the detection parameters.

Further features of the invention will emerge from the features of the sub-claims as well as the other application documents.

The invention will be explained in greater detail below with the aid of an example of embodiment. The features described therein may be of importance both individually as well as in any combination for the implementation of the invention. This also applies to the features that have been mentioned above to describe the arrangement and the adjusting device. The figures of the drawing show the following in detail:

FIG. 1 a cross-sectional side view of the arrangement according to the invention;

FIG. 2 a side view of the adjusting device;

FIG. 3 a plan view of the adjusting device;

FIG. 4 a cross-sectional side view of the adjusting device through intersecting line A-A from FIG. 3.

There is shown in FIG. 1 a light source 8 for infrared light, which sends infrared light through through-hole 5 of the adjusting device and is preferably arranged precisely beneath respective through-hole 5. Depending on how many through-holes 5 are contained in mounting fixture 4, a light source 8 can be arranged for each through-hole 5. Light can however be sent via deflection mirrors (not shown) with the aid of a light source 8 to several through-holes 5 of mounting fixture 4. Wafer 2 lies on mounting side 4a of mounting fixture 4, said wafer consisting of substrates or discs to be jointed, for example Si (Silicon) wafers or composite semiconductor materials, also referred to as a bond interface. The lower side of mounting fixture 4 is designated as entrance side 4b for the light from light source 8.

Above wafer 2 and in the extension of the light beam passing through through-hole 5 and wafer 2, there is arranged an optical detection device 7, which for example is a microscope for the micrometre-precise alignment of the two wafers. Depending on how many through-holes 5 are provided, microscopes 7 can in turn be provided for each through-hole 5. Alternatively, the detection can also take place here by means of deflection mirrors or similar devices.

The detection of the relative position to one another of the substrates or discs of wafers 2 to be jointed takes place by opposite-lying structures in the wafers, with the aid of which a micrometre-precise alignment of wafers 2 is possible by means of microscopes 7. Adjusting marks 6 are provided as such structures, which for example include a pattern, which is contained in the substrates to be jointed and which is used for the alignment by means of the microscopes and a displacement device (not shown), which is controlled by a control device (also not shown).

It can be seen in FIGS. 2, 3 and 4 that the mounting fixture 4 is placed in a mounting frame 3 for accommodating the mounting fixture 4. Spring-loaded clamps 1 are used for the mechanical fixing after the adjustment, so that adjusted wafers 2 can be fed together with the bond chuck/mounting fixture 4 to further treatment steps without slipping.

Through-holes 5 are shown in FIGS. 1, 3 and 4. They are respectively subdivided into a first portion 5.1, which extends from mounting side 4a into through-hole 5. Following on therefrom is second portion 5.2, which extends up to entrance side 4b of the light from light source 8. It can be seen in the plan view of FIG. 3 that the through-holes are designed as a slot. Alternatively, the through-hole can also be designed round.

The internal walls of first portion 5.1 of through-hole 5 lying respectively opposite one another run parallel to one another. The internal walls of second portion 5.2 run conically widening from first portion 5.1 up to entrance side 4b. No step is provided at the transition from first portion 5.1 to second portion 5.2, because otherwise a reflection of the light from light source 8 takes place.

If the wafer, after the adjustment with the arrangement and adjusting device according to the invention, is subjected together with bond chuck 4 in a further process step to a force F represented by the arrow in FIG. 2, the point at which the wafer experiences no counterforce by the bond chuck 4 is so small as a result of the design of through-hole 5 according to invention that defects no longer occur. These process steps and, consequently, problems occur for example in thermocompression processes, in which, for example, bonds with polymer adhesives (e.g. BCB Dow Corning, SU-8 Microchem), eutectic bonder bonds (e.g. Au—Si, Cu—Sn) or metal diffusion bonds (e.g. Au-Au, Cu-Cu) are used.

The size of through-hole 5, or more precisely the cross-section of through-hole 5, results according to the thickness of wafer 2. Standard wafer thicknesses are for example 380-750 μm. With the standard wafer thicknesses, diameters of approx. 5 mm have been tried and tested for through-hole 5 when through-hole 5 is round, and 10 mm when it is designed as a slot. With these designs, however, a pressure non-uniformity in the area of the through-hole is unavoidable. The present invention provides the possibility of reducing the size of through-hole 5 down to 0.1 mm. A well-balanced ratio of production costs with the avoidance of faults due to the application of pressure is achieved with a cross-section of 1 mm, a depth of first portion 5.1 of 1 mm and a depth of the second portion of 7 mm and an opening angle of second portion 5.2 of 90°.

The conical widening of second portion 5.2 confers upon mounting fixture 4 a high rigidity around through-hole 5. A deep cylindrical countersinking would weaken the material around through-hole 5 and result in a non-uniformity of the pressure distribution.

The invention claimed is:

1. An adjusting device for adjusting a wafer (2) on a mounting fixture (4), said mounting fixture (4) for mounting a wafer (2) thereon, the adjusting device comprised of:

a mounting fixture (4) having a mounting side (4a) for mounting a wafer (2) thereon, an entrance side (4b), and at least one though-hole (5) directed essentially orthogonal to the mounting side (4a), wherein the though-hole (5) on the mounting side (4a) has a smaller cross-section than on the entrance side (4b);

a light source (8) located below the mounting fixture (4) for transmitting light though the though-hole (5) from the entrance side (4b) to the mounting side (4a); and an optical detection device (7) located above the mounting fixture (4) for detecting the light transmitted through the though-hole (5) by the light source (8).

2. The adjusting device according to claim 1, characterised in that the through-hole (5) has a first portion (5.2), which extends from the mounting side (4a) into the through-hole (5) and whose internal wall runs essentially parallel to the centre axis of the through-hole (5).

3. The adjusting device according to claim 2, characterised in that the smallest diameter (d) of the first portion (5.1) of the through-hole (5) is smaller than 7 mm.

4. The adjusting device according to claim 2 or 3, characterised in that the through-hole (5) has a second portion (5.2), which extends from the first portion (5.1) up to the entrance side (4b).

5. The adjusting device according to claim 2, characterized in that the smallest diameter (d) of the first portion (5.1) of the through-hole (5) is smaller than 5 mm.

6. The adjusting device according to claim 2, characterized in that the smallest diameter (d) of the first portion (5.1) of the through-hole (5) is smaller than 3 mm.

7. The adjusting device according to claim 2, characterized in that the smallest diameter (d) of the first portion (5.1) of the through-hole (5) is smaller than 1 mm.

8. The adjusting device according to claim 1, characterised in that the cross-section of the through-hole (5) is designed slot-shaped.

9. The adjusting device according to claim 1, characterised in that the cross-section of the through-hole (5) is designed round.

10. The adjusting device according to claim 1, characterised in that the mounting fixture (4) is essentially disc-shaped and has two slot-shaped through-holes (5) arranged in the centre axis of the mounting fixture (4).

11. The adjusting device according to claim 1, characterised in that the through-hole (5) is 2 to 12 mm deep.

12. The adjusting device according to claim 1, characterised in that the first portion (5.1) extends from the mounting side (4a) 0.1 mm to 5 mm into the through-hole (5).

13. The adjusting device according to claim 1, characterised in that the second portion (5.2) extends from the first portion (5.1) into the entrance side (4b) and runs conically widening at an angle of 70°.

14. The adjusting device according to claim 1, characterised in that the mounting fixture (4) is made from silicon carbide.

15. The adjusting device according to claim 1, characterised in that the mounting fixture (4) is made from titanium.

16. An adjusting device with a mounting fixture (4) for mounting a wafer (2) on a mounting side (4a) of the mounting fixture (4), according to claims 1-3, 8-14 or 15, wherein an infrared light strikes an optical detection device (7) though the through-hole (5) via a structure integrated into the wafer and allows for the alignment of the wafer (2) on the basis parameters detected by the optical detection device (7).

17. The adjusting device according to claim 1, characterized in that the through-hole (5) is 8 mm deep.

18. The adjusting device according to claim 1, characterized in that the first portion (5.1) extends from the mounting side (4a) 1 mm into the through-hole (5).

19. The adjusting device according to claim 1, characterized in that the second portion (5.2) extends from the first portion (5.1) into the entrance side (4b) and runs conically widening at an angle of 90°.

* * * * *

UNITED STATES PATENT AND TRADEMARK OFFICE
CERTIFICATE OF CORRECTION

| | | |
|---|---|---|
| PATENT NO. | : 7,432,701 B2 | Page 1 of 1 |
| APPLICATION NO. | : 11/130950 | |
| DATED | : October 7, 2008 | |
| INVENTOR(S) | : Erich Thallner | |

It is certified that error appears in the above-identified patent and that said Letters Patent is hereby corrected as shown below:

Column 4, line 33, claim 1 "though" should be changed to --through--;

Column 4, line 36, claim 1 "though" should be changed to --through--;

Column 4, line 39, claim 1 "though" should be changed to --through--;

Column 4, line 43, claim 1 "though" should be changed to --through--; and

Column 4, line 55, claim 4 insert the following text before the period --, whereby the cross-section of the second portion (5.2) increases, preferably conically, up to the entrance side (4b)--.

Column 5, line 16, claim 13 insert the following text before the period --to 120°--.

Signed and Sealed this

Thirtieth Day of December, 2008

JON W. DUDAS
*Director of the United States Patent and Trademark Office*

UNITED STATES PATENT AND TRADEMARK OFFICE
CERTIFICATE OF CORRECTION

PATENT NO. : 7,432,701 B2 Page 1 of 1
APPLICATION NO. : 11/130950
DATED : October 7, 2008
INVENTOR(S) : Erich Thallner It is certified that error appears in the above-identified patent and that said Letters Patent is hereby corrected as shown below:

Column 4, line 39, claim 1 "though-hole" should be changed to --through-hole--.

Column 6, line 6, claim 16 "though" should be changed to --through--.

Signed and Sealed this

Tenth Day of March, 2009

JOHN DOLL
*Acting Director of the United States Patent and Trademark Office*